United States Patent [19]
Aoike

[11] Patent Number: 5,338,370
[45] Date of Patent: Aug. 16, 1994

[54] PHOTOVOLTAIC DEVICE

[75] Inventor: Tatsuyuki Aoike, Nagahama, Japan

[73] Assignee: Canon Kabushiki Kaisha, Tokyo, Japan

[21] Appl. No.: 878,478

[22] Filed: May 5, 1992

[30] Foreign Application Priority Data

May 7, 1991 [JP] Japan .................. 3-130242

[51] Int. Cl.$^5$ .......................................... H01L 31/075
[52] U.S. Cl. .................... 136/258; 257/458; 136/256
[58] Field of Search .............. 136/258 AM, 258 PC, 136/259, 256; 257/458

[56] References Cited

U.S. PATENT DOCUMENTS

| | | | |
|---|---|---|---|
| 4,064,521 | 12/1977 | Carlson | 357/2 |
| 4,765,845 | 8/1988 | Takada et al. | 136/258 AM |
| 4,886,723 | 12/1989 | Aoike et al. | 430/65 |

FOREIGN PATENT DOCUMENTS

| | | | |
|---|---|---|---|
| 59-43101 | 10/1984 | Japan | 136/256 |
| 60-239069 | 11/1985 | Japan | 136/258 AM |

OTHER PUBLICATIONS

Spear et al., "Substitutional Doping of Amorphous Silicon", *Solid State Communications*, vol. 17, pp. 1193–1196 (1975).

*Primary Examiner*—Aaron Weisstuch
*Attorney, Agent, or Firm*—Fitzpatrick, Cella, Harper & Scinto

[57] ABSTRACT

A photovoltaic device produced by successively laminating on a conductive substrate a transparent conductive layer, a silicon containing non-monocrystal layer of a first conductivity type; a silicon containing non-monocrystal layer of an i-type; a silicon containing non-monocrystal layer of a second conductivity type different from the first conductivity type; and an electrode, wherein the silicon containing non-monocrystal layer of the first conductivity type contains at least one element which constitutes the transparent conductive layer.

12 Claims, 3 Drawing Sheets

PHOTOVOLTAIC DEVICE

BACKGROUND OF THE INVENTION

1. Field of the Invention

The present invention relates to a photovoltaic device, and, more particularly to a photovoltaic device such as a solar cell or the like which uses amorphous silicon (hereinafter abbreviated to "a-Si:H").

A photovoltaic device of the type described above can be suitably used as a power source, and more particularly as a power source for electricity for use in various electronic devices and power devices.

2. Related Background Art

The study of applying a-Si:H to a photovoltaic device such as a solar cell started with the invention of a photovoltaic device by D. E. Carlson (U.S. Pat. No. 4,064,521) on the basis of a succession of doping processes (*Solid State Communications*, Vol. 17, pp. 1193–1196, 1975) discovered by W. E. Spear and P. G. Le Comber.

Recently, photovoltaic devices having a-Si:H have been used in clocks, compact calculators, outdoor lamps, etc. However, problems of low conversion efficiency and deterioration in the characteristics with time arise if the a-Si:H photovoltaic device is used for generating electricity. Accordingly, various studies have been made in order to further improve the conversion efficiency of the a-Si:H photovoltaic device and to prevent deterioration in the characteristics of the same with time.

Hitherto, occurrence of a short circuit in the photovoltaic device has been prevented by forming a transparent conductive layer between a conductive substrate and the a-Si:H. Furthermore, the conversion efficiency has been improved by utilizing the reflection enhancing effect (Japanese Patent Publication Patent No. 59-43101). However, although forming of the transparent conductive layer will improve the conversion efficiency, a satisfactory effect of preventing deterioration in the characteristics cannot be obtained. In particular, in a case where the photovoltaic device is used for generating electric power, there is a desire of preventing the deterioration in the characteristics. Since the deterioration in the characteristics is mainly due to light irradiation, it is a critical problem when the photovoltaic device is used.

Hitherto, a first conductivity type layer has been considered to be a part of the photoelectric conversion portion of the photovoltaic device. Therefore, it has been considered that modification of the first conductivity type layer will improve the conversion efficiency of the photoelectric conversion portion and prevent deterioration. However, it is too complicated and difficult to improve the conversion efficiency of only the photoelectric conversion portion and to prevent deterioration in the characteristics.

SUMMARY OF THE INVENTION

The present invention is based on new knowledge about the mutual relationship between a transparent conductive layer and a first conductivity type layer, so that the aforesaid problems can be overcome.

It was found that deterioration can be prevented by causing the first conductivity type layer to contain the elements which constitute the transparent conductive layer. Although the mechanism for preventing deterioration has not been clarified yet, it can be considered that the consistency of the interface between the transparent conductive layer and the first conductivity type layer can be improved by causing the first conductivity type layer to contain the elements which constitute the transparent conductive layer. As a result, the carrier injection can be improved, causing the flow of the carriers in the photovoltaic device to be smooth. Therefore, an unnecessary load causing deterioration of the photovoltaic device does not occur. Furthermore, since the elements which constitute the transparent conductive layer are positively contained by the first conductivity type layer, the aforesaid elements are injected into the first conductivity type layer so as to be strongly bonded. As a result, the diffusion of the elements in the transparent conductive layer into the i-type layer can be prevented and therefore the quality of the i-type layer does not deteriorate. Consequently, deterioration can be prevented.

An object of the present invention is to provide a photovoltaic device capable of overcoming the aforesaid problems experienced with the conventional technology and capable of significantly preventing the characteristic deterioration while maintaining an improved conversion efficiency of an a-Si:H photovoltaic device.

According to one aspect of the invention, there is provided a photovoltaic device comprising in order: a transparent conductive layer; a Si containing non-monocrystal layer of a first conductivity type; a Si containing non-monocrystal layer of an i-type; a Si containing non-monocrystal layer of a second conductivity type, which is different from the first conductivity type; and an electrode, which are layered on a conductive substrate and which are disposed as described above when viewed from said conductive substrate, wherein the Si containing non-monocrystal layer of the first conductivity type contains an element which constitutes the transparent conductive layer.

Other objects, features, and advantages of the invention will be appear more fully from the following description.

DESCRIPTION OF THE PREFERRED EMBODIMENTS

Figure 1:
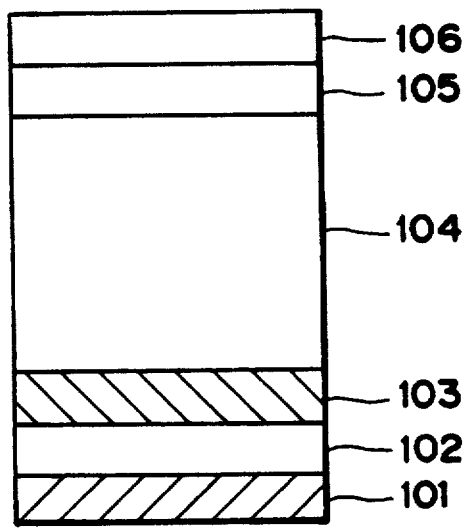
FIG. 1 is schematic structural view which illustrates the arrangement of layers of a photovoltaic device according to the present invention.

FIG. 1 is a schematic view which illustrates a photovoltaic device according to the present invention. Referring to FIG. 1, the photovoltaic device according to the present invention comprises a conductive substrate 101, a transparent conductive layer 102, a first conductivity type layer 103, an i-type layer 104, a second conductivity type layer 105, and an electrode 106.

Figure 2:
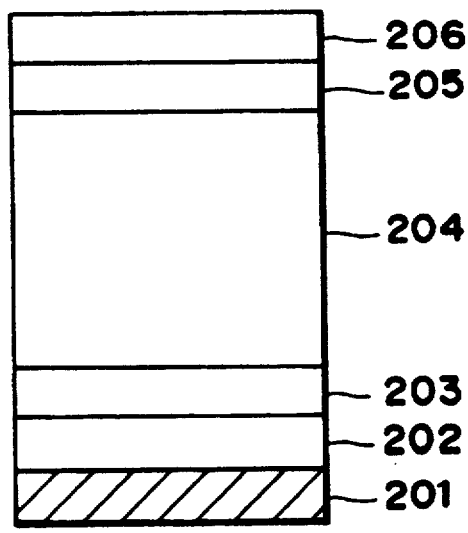
FIG. 2 illustrates a schematic structural view which illustrates a typical example of the arrangement of layers of a conventional photovoltaic device.

FIG. 2 is a schematic view which illustrates a typical example of a conventional photovoltaic device.

The conventional photovoltaic device shown in FIG. 2 comprises a conductive substrate 201, a transparent conductive layer 202, a first conductivity type layer 203, an i-type layer 204, a second conductivity type layer 205, and an electrode 206.

The photovoltaic device according to the present invention is different from the conventional photovoltaic device in that the first conductivity type layer 103 contains elements which constitute the transparent conductive layer 102. The inventor of the present invention has found that a critical factor for preventing deterioration in the characteristics of the photovoltaic device is to constitute the structure in such a manner that the first conductivity type layer 103 contains the elements which constitute the transparent conductive layer 102.

Hitherto, the transparent conductive layer has been provided for the purpose of improving the conversion efficiency by preventing a short circuit and increasing the amount of reflection, while the first conductivity type layer has served as a portion of a photoelectric conversion section. That is, they have been considered as sections which have different functions. Therefore, the presence of common elements has not been studied.

The layers which constitute the photovoltaic device according to the present invention will now be described.

Conductive Substrate

The conductive substrate may be made of conductive material or constituted in such a manner that its supporting base member is formed of insulating material or conductive material and the surface of the supporting member is subjected to a treatment to make it conductive.

The conductive supporting member may be made of a metal such as NiCr, stainless steel (SUS), Al, Cr, Mo, Au, Nb, Ta, V, Ti, Pt, Pb, or their alloys.

The electrically insulating supporting member may be constituted by a film made of a synthetic resin such as polyester, polyethylene, polypropylene, polyvinyl chloride, polyvinylidene chloride, polystyrene, polyamide, or a sheet of glass, ceramics, paper, or the like. It is preferable that one side of the electrically insulating supporting member be subjected to a treatment rendering it conductive and that a photovoltaic layer be formed on the surface of the thus formed conductive layer.

The aforesaid conductive treatment is performed in such a manner that a thin film of metal such as Ag, Al, Au, Cr, Ir, Ni, Pd, Pt, Ta, Ti, Tl, V, Zn, etc. or their alloys is formed on the surface of the supporting base member by vacuum evaporation, electron beam evaporation, sputtering, or the like. As an alternative, the aforesaid surface is laminated with the above-described metal so as to make the surface conductive.

The supporting member may be formed into a flat plate, one having pits and recesses on the surface thereof, a belt-like shape, a cylindrical shape, or the like. The thickness of the supporting member is determined as required in order to form a desired photovoltaic device. In the case where a flexible photovoltaic device is desired, the thickness can be decreased by a quantity which still allows the supporting member to sufficiently exhibit its function. However, in general, it is preferable that the thickness be 10 μm or more from the viewpoint of manufacturing and handling feasibility and mechanical strength.

Transparent Conductive Layer

In the case where application of light to the semiconductor layer is performed through the transparent conductive layer, it is preferable that the light transmissivity of the transparent conductive layer according to the present invention be 85% or more in order to permit light from the sun or from a white fluorescent lamp or the like to be efficiently absorbed in the semiconductor layer. Also, in the case where light is applied to the transparent conductive layer through the semiconductor layer, it is preferable that the transmissivity be 85% or more in order to cause light, which has not been absorbed by the semiconductor layer, to be efficiently reflected back to the semiconductor layer, whereby the transparent conductive layer functions as a reflection enhancing film. The sheet resistance value is preferably 100Ω or less in order to prevent it from acting as an electrical resistance to the output from the photovoltaic device. Material having the aforesaid characteristics is exemplified by a metal oxide or a nitride such as $SnO_2$, $In_2O_3$, ITO ($SnO_2+In_2O_3$), ZnO, CdO, $Cd_2SnO_4$, $TiO_2$, $Ti_3N_4$, or the like, or a semitransparent metal thin film formed by a very thin layer of metal such as Au, Al, Cu, or the like.

A method of manufacturing the transparent conductive layer may be selected from resistance heating and evaporating, electron beam heating and evaporating, sputtering, and spraying. It is preferable that the thickness of the transparent conductive layer be 3 to 200 nm.

First Conductivity Type Layer

The first conductivity type layer of the photovoltaic device according to the present invention enables the aforesaid problems to be overcome and determines the photovoltaic force of the photovoltaic device and the photoelectric current.

As the material for the first conductivity type layer, a non-monocrystal semiconductor containing silicon is suitable, and more particularly, a hydrogenated and/or halogenated non-monocrystal silicon semiconductor is suitable. It is preferable that the content of the hydrogen/halogen atoms be 1 atom % to 40 atom %.

As a result of the study made by the inventor of the present invention, it was found that an arrangement in which the first conductivity type layer contains the elements which constitute the transparent conductive layer will prevent deterioration.

The fact that elements which constitute the transparent conductive layer are contained means that one or more elements which are common to the transparent conductive layer and the first conductivity type layer are present. A more satisfactory effect can be obtained in a case where the major element is the common element as compared with the case in which a non-major element is the common element.

The element which can be contained can be selected from a group consisting of Sn, In, Zn, Cd, Ti, O, N, Au, Al, Cu, and the like, according to the structure of the transparent conductive layer. As a result of study, it was found that the content of the common element is preferably 0.1 atom ppm to 1 atom %, more preferably 1 atom ppm to 1000 atom ppm, and most preferably 10 atom ppm to 100 atom ppm. If the content is too large, the performance of the photovoltaic device is deteriorated. If it is too small, a satisfactory effect cannot be obtained.

Furthermore, as a result of the study, the aforesaid elements may be contained by the entire first conductivity type layer or by a partial region of the same. The content of the elements may be distributed equally or unequally in the direction of the thickness of the layer. That is, the film forming process may be performed while omitting control of the element distribution. The content of the aforesaid elements can be measured by a secondary ion composition analysis method or the like.

In the case where the conductivity type of the first conductivity type layer is n-type, it is preferable that an additive contained in the first conductivity type layer be an element selected from elements of group VA of the periodic table. Among these, phosphorous (p), nitrogen (N), arsenic (As), and antimony (Sb) are suitable.

In the case where the conductivity type of the first conductive type layer is p-type, it is preferable that an additive contained in the first conductivity type layer be an element selected from elements of group IIIA of the periodic table. Among these, boron (B), aluminum (Al), and gallium (Ga) are suitable.

Furthermore, it is preferable that the quantity of the additive contained in the first conductivity type layer be 0.1 atom % to 20 atom %, preferably 0.5 atom % to 10 atom %.

As for the electronic characteristics of the first conductivity type layer, it is preferable that the activation energy be 0.2 eV or less, preferably 0.1 eV or less. It is preferable that the specific resistance be 10 $\Omega$cm or less, preferably 1 $\Omega$cm or less.

Taking the light transmissivity and conductivity into consideration, it is preferable that the thickness of the first conductivity type layer be 1 nm to 50 nm, preferably 3 nm to 10 nm.

In order to further reduce the light absorption in the first conductivity type layer in the case where light irradiation is performed from the side of the first conductivity type layer, it is preferable that non-monocrystal silicon carbide be used.

It is preferable that the content of carbon in the non-monocrystal silicon carbide be 5 atom % to 50 atom %, preferably 10 atom % to 30 atom %. It is preferable that the other conditions be made the same as those for the first conductivity type layer which uses the aforesaid non-monocrystal silicon.

i-Type Layer

According to the present invention, the i-type layer is a critical layer for generating and transporting carriers when it is irradiated with light. The silicon containing non-monocrystal material suitable for the i-type layer is exemplified by amorphous silicon (including fine crystal silicon). Among others, hydrogenated amorphous silicon or hydrogenated and/or halogenated amorphous silicon is suitable.

It is preferable that the content of hydrogen or halogen contained in the amorphous silicon be 1 atom % to 40 atom %, preferably 5 atom % to 20 atom %.

In order to raise the open circuit voltage level according to the present invention, the non-monocrystal material for the i-type layer is exemplified by amorphous silicon carbide (fine crystal silicon carbide included). In particular, hydrogenated and halogenated amorphous silicon carbide are exemplified.

It is preferable that the content of the carbon atoms be 3 atom % to 30 atom %, preferably 5 atom % to 20 atom %.

It is preferable that the content of the hydrogen atoms and the halogen atoms be 1 atom % to 40 atom %, preferably 5 atom % to 20 atom %.

In order to improve the long wave sensitivity and to increase the short-circuit electric current according to the present invention, a non-monocrystal material exemplified by amorphous silicon germanium (fine crystal silicon germanium included) is used. In particular, hydrogenated and halogenated amorphous silicon germanium is suitable.

It is preferable that the content of germanium atoms be 5 atom % to 70 atom %, preferably 10 atom % to 60 atom %.

It is preferable that the content of hydrogen atoms and halogen atoms be 1 atom % to 40 atom %, preferably 5 atom % to 20 atom %.

The thickness of the i-type layer is a critical parameter which determines the characteristics of the photovoltaic device. It is preferable that the thickness of the i-type layer be 100 nm to 1,000 nm, preferably 200 nm to 600 nm.

It is preferable that the aforesaid thickness is in the aforesaid range while taking the light adsorption coefficient and the spectrum of the light source into consideration.

Second Conductivity Type Layer

According to the present invention, the second conductivity type layer is a critical layer which determines the voltage of the photovoltaic device and the photoelectric current.

As the material for the second conductivity type layer, a non-monocrystal semiconductor containing silicon is suitable. In particular, hydrogenated and/or halogenated amorphous silicon (fine crystal silicon included) semiconductor is suitable. Specifically, fine crystal silicon included among the amorphous silicon is suitable. It is preferable that the particle size of the fine crystal silicon is 3 nm to 20 nm, preferably 3 nm to 10 nm.

In the case of the fine crystal silicon, it is preferable that the content of hydrogen/halogen atoms is 1 atom % to 10 atom %, preferably 1 atom % to 7 atom %.

In the case of the amorphous silicon, it is preferable that the content of hydrogen/halogen atoms is 1 atom % to 30 atom %, preferably 5 atom % to 20 atom %.

In the case where the conductivity type of the second conductivity type layer is p-type, it is preferable that an additive be an element in group IIIA of the periodic table. Among them, boron (B), aluminum (Al) , and gallium (Ga) are suitable.

In the case where the conductivity type of the second conductivity type layer is n-type, it is preferable that an additive be an element selected from the elements of group VA of the periodic table. Among these, phosphorous (P), nitrogen (N), arsenic (As), and antimony (Sb) are suitable.

Furthermore, it is preferable that the quantity of the additive contained by the second conductivity type layer be 0.1 atom % to 20 atom %, preferably 0.5 atom % to 10 atom %.

As for the electronic characteristics of the second conductivity type layer, it is preferable that the activation energy be 0.2 eV or less under the aforesaid conditions, preferably 0.1 eV or less. It is preferable that the specific resistance be 10 $\Omega$cm or less, preferably 1 $\Omega$cm or less.

It is preferable that the thickness of the second conductivity type layer be 1 nm to 50 nm, preferably 3 nm to 10 nm.

In order to further reduce the light absorption in the second conductivity type layer in the case where light irradiation is performed from the side of the second conductivity type layer, it is preferable that non-monocrystal silicon carbide be used.

It is preferable that the content of carbon in the non-monocrystal silicon carbide be 5 atom % to 50 atom %, preferably 10 atom % to 30 atom %. It is preferable that the other conditions be made the same as those for the second conductive type layer which uses the aforesaid non-monocrystal silicon.

Electrode

In the case where light irradiation is performed through the electrode 106, it is preferable that the light transmissivity of the electrode according to the present invention be 85% or more in order to cause light from the sun or from a white fluorescent lamp or the like to be efficiently absorbed in the semiconductor layer. The sheet resistance value is preferably 100 Ω or less in order to prevent the electrode from acting as an electrical resistance to the output from the photovoltaic device. Material having the aforesaid characteristics is exemplified by a metal oxide such as $SnO_2$, $In_2O_3$, ITO ($SnO_2+In_2O_3$), ZnO, CdO, $Cd_2SnO_4$, $TiO_2$, or $Ti_3N_4$, or the like, or a semitransparent metal thin film formed by Au, Al, Cu, or the like.

In the case where light application is performed from the side of the conductive substrate, it is preferable that the sheet resistance value be 100Ω or less in order to prevent it from acting as an electrical resistance to the output from the photovoltaic device. Material having the aforesaid characteristics is exemplified by metals such as Ag, Al, Au, Co, Cr, Cu, Fe, Mg, Mo, Ni, Pd, Pt, Zn, etc., or their alloys. In order to cause light, which has not been absorbed by the semiconductor layer, to be efficiently reflected to the semiconductor layer, a reflection enhancing film may be formed between the semiconductor layer and the electrode. It is preferable that the light transmissivity of the aforesaid reflection enhancing film be 85% or more. The sheet resistance value is preferably 100 Ω or less in order to prevent acting as an electrical resistance component to the output from the photovoltaic device. Material having the aforesaid characteristics is exemplified by a metal oxide or a nitride such as $SnO_2$, $In_2O_3$, ITO ($SnO_2+In_2O_3$), ZnO, CdO, $Cd_2SnO_4$, $TiO_2$, $Ti_3N_4$, or the like.

A method of manufacturing the electrode may be selected from resistance heating and evaporating, electron beam heating and evaporating, sputtering, and spraying.

It is suitable for the first conductivity type layer, the i-type layer, and the second conductivity type layer to be formed by a DC glow discharge decomposition method, an RF glow discharge decomposition method or a microwave glow discharge decomposition method, or the like.

A raw material gas suitable for use in the glow discharge decomposition method will now be described.

The raw material gas for supplying Si for use in the present invention is exemplified by a gaseous hydride silicon (silane) or one which can be gasified, such as $SiH_4$, $Si_2H_6$, $Si_3H_8$, $Si_4H_{10}$, or the like. Among these, $SiH_4$ and $Si_2H_6$ are preferable in terms of their handling feasibility and excellent efficiency of supplying Si.

The raw material gas for supplying the halogen atoms is exemplified by a variety of halogen compounds. For example, it is exemplified by a halogen compound which is formed into a gas or which can be gasified, such as a halogen gas, a halide, an interhalogen compound, or a silane derivative substituted by halogen.

Also, a silicon compound, the component elements of which are silicon atoms and halogen atoms, which is formed into a gas or which contains halogen atoms which can be gasified are exemplified as effective materials.

A preferable halogen compound according to the present invention is exemplified by gaseous halogens, e.g. fluorine, chlorine, bromine, or iodine or an interhalogen compound such as BrF, ClF, $ClF_3$, $BrF_5$, $BrF_3$, $IF_3$, $IF_7$, ICl, IBr, or the like.

A preferable silicon compound containing halogen atoms, that is, a so-called silane derivative substituted by halogen atoms is exemplified by a silicon halide such as $SiF_4$, $Si_2F_6$, $SiCl_4$ or $SiBr_4$.

Although the aforesaid halogen compound or silicon compound containing halogen atom is used as a preferable material gas for supplying halogen atoms according to the present invention, a halogen compound which is formed in a gaseous state or which can be gasified and which also contains hydrogen atoms may be used as a preferable raw material gas, for example, hydrogen halides such as HF, HCl, HBr, or HI, or halogen substituted silicon halides such as $SiH_3F$, $SiH_2F_2$, $SiHF_3$, $SiH_2I_2$, $SiH_2Cl_2$, $SiHCl_3$, $SiH_2Br_2$, or $SiHBr_3$.

The aforesaid halogen compound containing hydrogen atoms is used as a preferable raw material gas for supplying halogen atoms because it is able to supply hydrogen atoms which are able to effectively control the electric or photovoltaic characteristics simultaneously with supplying the halogen atoms at the time of the layer formation.

As the raw material gas for supplying hydrogen atoms, $H_2$ or a silicon halide such as $SiH_4$, $Si_2H_6$, $Si_3H_8$, or $Si_4H_{10}$ is exemplified.

According to the present invention, as a gas for supplying germanium, germanium hydride such as $GeH_4$, $Ge_2H_6$, $Ge_3H_8$, $Ge_4H_{10}$, $Ge_5H_{12}$, $Ge_5H_{14}$, $Ge_7H_{16}$, $Ge_8H_{18}$, $Ge_9H_{20}$, or germanium hydride halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, or $GeH_3I$, or a germanium halide such as $GeF_4$, $GeCl_4$, $GeBr_4$, $GeI_4$, $GeF_2$, $GeCl_2$, $GeBr_2$, $GeI_2$ or the like are exemplified.

As a compound containing carbon atoms serving as a material for supplying carbon atoms, saturated hydrocarbons having 1 to 4 carbons, ethylenic hydrocarbons having 2 to 4 carbons and acetylenic hydrocarbons having 2 to 3 carbons are exemplified.

Specifically, the saturated hydrocarbon is exemplified by methane ($CH_4$), ethane ($C_2H_6$), propane ($C_3H_8$), n-butane (n-$C_4H_{10}$) and pentane ($C_5H_{12}$). The ethylenic type hydrocarbon is exemplified by ethylene ($C_2H_4$), propylene ($C_3H_6$), butene-1 ($C_4H_8$), butene-2 ($C_2H_8$), isobutylene ($C_4H_8$), and pentene ($C_5H_{10}$). The acetylenic type hydrocarbon is exemplified by acetylene ($C_2H_2$), methylacetylene ($C_3H_4$) and butane ($C_4H_6$).

Raw material gas, the component atoms of which are Si, C and H, is exemplified by alkyl silicides such as $Si(CH_3)_4$ and $Si(C_2H_4)_4$.

In the case where glow discharge is used to form a layer which contains atoms of group III or group V, the starting material which becomes the raw material gas for forming the various layers is prepared by adding a starting material for supplying the group III or group V atoms to a selected starting material containing silicon atoms. As the starting material for supplying group III or V atoms, any gaseous material or material which can be gasified may be employed, a component atom of which is an atom of groups III or V.

A preferable starting material for supplying the group III atoms according to the present invention is exemplified by boron hydrides such as $B_2H_6$, $B_4H_{10}$, $B_5H_9$, $B_5H_{11}$, $B_6H_{10}$, $B_6H_{12}$, and $B_6H_{14}$ and boron halides such as $BF_3$, $BCl_3$, and $BBr_3$. Furthermore, $AlCl_3$, $GaCl_3$, $InCl_3$, and $TlCl_3$ may be preferably employed.

A starting material for supplying the group V atoms according to the present invention is exemplified by phosphorus hydrides such as $PH_3$ and $P_2H_4$, and $PH_4I$, $PF_3$, $PF_5$, $PCl_3$, $PCl_5$, $PBr_3$, $PBr_5$, $PI_3$, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, $N_2$, $NH_3$, $H_2NNH_2$, $HN_3$, $NH_4N_3$, $F_3N$, and $F_4N_2$.

According to the present invention, the gas for supplying zinc atoms is exemplified by a material gasified by bubbling $Zn (CH_3)_2$ or $Zn (C_2H_5)_2$ using a bubbling apparatus while using an inactive gas such as Ar or He gas as a carrier gas or materials gasified by heating or boiling them.

According to the present invention, the gas for supplying indium atoms is exemplified by a material gasified by bubbling $In (CH_3)_3$, $In (C_2H_5)_3$, $In (C_3H_7)_3$, and $In (C_4H_9)_3$ using a bubbling apparatus while using an inactive gas such as Ar or He gas as a carrier gas for materials gasified by heating or boiling them. According to the present invention, the gas or supplying tin atoms is exemplified by material gasified by bubbling $SnH_4$, $SnCl_4$, $SnBr_4$, $Sn (CH_3)_4$, $Sn (C_2H_5)_4$, $Sn (C_3H_7)_4$, and $Sn (C_4H_9)_4$ using a bubbling apparatus while using an inactive gas such as Ar or He gas as a carrier gas or materials gasified by heating or boiling them.

According to the present invention, the gas for supplying titanium atoms is exemplified by a material gasified by bubbling $TiCl_4$, $TiBr_4$, $Ti (OC_2H_5)_4$, $Ti (OC_3H_7)_4$, and $Ti (OC_4H_9)_4$ using a bubbling apparatus while using an inactive gas such as Ar or He gas as a carrier gas or materials gasified by heating or boiling them.

According to the present invention, the gas for supplying cadmium atoms is exemplified by a material gasified by bubbling $Cd (CH_3)_2$, $Cd (C_2H_5)_2$, $Cd (C_3H_7)_2$, and $Cd (C_4H_9)_2$ using a bubbling apparatus while using an inactive gas such as Ar or He gas as a carrier gas or materials gasified by heating or boiling them.

According to the present invention, the gas for supplying oxygen atoms is exemplified by oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), and nitrogen trioxide ($NO_3$), and lower siloxanes such as disiloxane ($H_2SiOSiH_3$) or trisiloxane ($H_3SiOSiH_2OSiH_3$), the component atoms of which are silicon atoms (Si), oxygen atoms (O) and hydrogen atoms (H).

According to the present invention, the gas for supplying nitrogen atoms is exemplified by nitrogen, nitride and a nitrogen compound such as azide, such as nitrogen ($N_2$), ammonia ($NH_3$), hydrazine ($H_2NNH_2$), hydrogen azide ($HN_3$), and ammonia ($NH_4N_3$). Furthermore, a nitrogen compound such as nitrogen trifluoride ($NF_3$) and nitrogen tetrafluoride ($N_2F_4$) may be used because halogen atoms can be supplied as well as nitrogen atoms.

EXAMPLE 1

The photovoltaic device according to the present invention was manufactured by the microwave (hereinafter abbreviated to "μw") glow discharge decomposition method.

Figure 3:
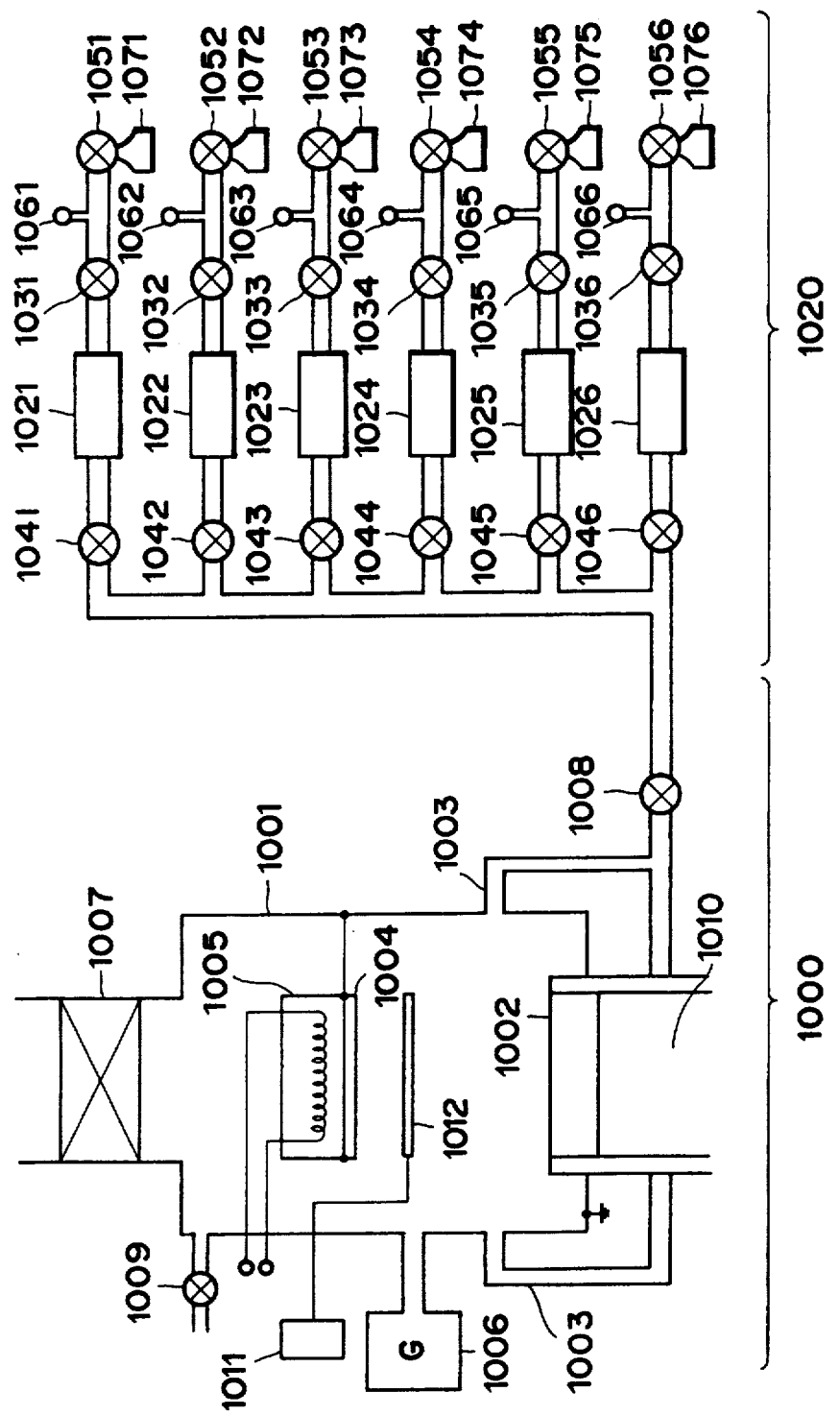
FIG. 3 is a schematic view which illustrates an example of an apparatus for manufacturing the photovoltaic device according to the present invention by a glow discharge method in which microwaves ($\mu$W) are used.

FIG. 3 illustrates an apparatus for manufacturing the photovoltaic device comprising a raw material gas supplying device 1020 and a depositing device 1000 and arranged to act by the μw glow discharge decomposition method.

Referring to FIG. 3, raw material gases for forming various layers according to the present invention are enclosed in gas cylinders 1071 to 1076. Reference numeral 1071 represents a $SiH_4$ gas cylinder, 1072 represents a $H_2$ gas cylinder and 1073 represents a gas cylinder in which $B_2H_6$ gas diluted with $H_2$ gas to 10% (hereinafter abbreviated to "$B_2H_6/H_2$") is contained. Reference numeral 1074 represents a gas cylinder in which $PH_3$ gas diluted with $H_2$ gas to 10% (hereinafter abbreviated to "$PH_3/H_2$") is contained. Reference numeral 1075 represents a gas cylinder in which NO gas diluted with helium gas to 0.1% (hereinafter abbreviated to "NO/He") is contained. Reference numeral 1076 represents a bubbling device in which $Zn (CH_3)_2$ is contained and which uses He gas as a carrier gas (hereinafter abbreviated to "$Zn (CH_3)_2$/He gas cylinder"). When the gas cylinders 1071-1075 and bubbling device 1076 are attached to the system, each gas is introduced into valves 1031 to 1036 through valves 1051 to 1056.

Referring to the drawing, reference numeral 1004 represents a conductive substrate made of a stainless steel (SUS430BA) plate 50 mm square having a thickness of 1 mm manufactured in such a manner that its surface is mirror-finished and a silver thin film serving as a reflecting layer is evaporated thereon to a thickness of 100 nm by a sputtering method. Then, a 1 μm thick ZnO thin film serving as a transparent conductive layer is evaporated on the conductive substrate by the sputtering method.

The gases are then introduced as follows: $SiH_4$ gas was introduced from the gas cylinder 1071, $H_2$ gas was introduced from the gas cylinder 1072, $B_2H_6/H_2$ gas was introduced from the gas cylinder 1073, $PH_3/H_2$ gas was introduced from the gas cylinder 1074, NO/He gas was introduced from the gas cylinder 1075 and $Zn (CH_3)_2$/He gas was introduced from the bubbling device 1076 by opening the corresponding valves 1051 to 1056. Then, pressure regulators 1061 to 1066 were used to adjust the pressure level of each of the gases to about 2 kg/cm$^2$.

Then, closure of the introduction valves 1031 to 1036 and leak valve 1009 of the decomposition chamber 1001 was confirmed. Furthermore, closure of discharge valves 1041 to 1046 and auxiliary valve 1008 was confirmed. Then, a conductance (a butterfly type) valve 1007 was fully opened and the inside portion of the decomposition chamber 1001 and the gas pipe were exhausted by a vacuum pump (omitted from illustration) until the reading of the vacuum gage 1006 reached about $1 \times 10^{-4}$ Torr. At this time, the auxiliary valve 1008 and the discharge valves 1041 to 1046 were closed.

Then, the introduction valves 1031 to 1036 were gradually opened, so that the aforesaid gases were introduced into mass flow controllers 1021 to 1026.

After the preparation procedure for forming the film had been completed as described above, the n-type layer was formed as the first conductivity type layer, next the i-type layer and the p-type layer was formed as the second conductivity type layer.

The n-type layer was formed by heating the substrate 1004 up to 350° C. by a heater 1005 and by gradually opening the discharge valves 1041 and 1044 to 1046 and the auxiliary valve 1008. As a result, $SiH_4$ gas, $PH_3/H_2$ gas, NO/He gas, and Zn $(CH_3)_2$/He gas were introduced into the decomposition chamber 1001 through the gas introduction pipe 1003. At this time, the flow of the $SiH_4$ gas was set at 30 sccm, that of the $PH_3/H_2$ gas was 6 sccm, that of the NO/He gas was 3 sccm, and that of the Zn $(CH_3)_2$ was $5 \times 10^{-7}$ mol/min by adjusting the corresponding mass flow controllers 1021, 1024 to 1026. The pressure in the decomposition chamber 1001 was set at 10 mTorr by adjusting the opening of the conductance valve 1007 while observing the vacuum gage 1006. Then, the power output of the $\mu w$ power source (omitted from illustration) was set at 50 mW/cm$^3$ and the $\mu W$ energy was introduced into the decomposition chamber 1001 through a waveguide pipe (omitted from illustration), a waveguide portion 1010, and a window 1002. As a result, the $\mu W$ glow discharge was generated and the forming of the n-type layer on the transparent conductive layer was commenced until an n-type layer 10 nm in thickness was formed. At this time, the $\mu W$ glow discharge was stopped, the discharge valves 1041, 1044 to 1046, and the auxiliary valve 1008 were closed and the gas introduction into the decomposition chamber 1001 was stopped. Thus, the process of forming the n-type layer was completed.

Then, the i-type layer was formed by heating the substrate 1004 up to 350° C. by means of heater 1005 and by gradually opening the discharge valves 1041 and 1044 to 1046 and the auxiliary valve 1008. As a result, $SiH_4$ gas and $H_2$ gas were introduced into the decomposition chamber 1001 through the gas introduction pipe 1003. At this time, the flow of the $SiH_4$ gas was set at 100 sccm and that of the $H_2$ gas was 200 sccm by adjusting the corresponding mass flow controllers 1021 and 1022. The pressure in the decomposition chamber 1001 was set at 5 mTorr by adjusting the opening of the conductance valve 1007 while observing the vacuum gage 1006. Then, the high frequency (hereinafter "RE") bias of the bias power source 1011 was set to 20 mW/cm$^3$ and the DC bias was set to 50 V with respect to the substrate 1004 so as to be applied to a bias rod 1012. Then, the output of a $\mu W$ power source (omitted from illustration) was set at 200 mW/cm$^3$ and introduced into the decomposition chamber 1001 through the waveguide pipe (omitted from illustration), the waveguide portion 1010, and the window 1002. As a result, the $\mu W$ glow discharge generated, so that the forming of the i-type layer on the n-type layer was commenced until an i-type layer 400 nm in thickness was formed. Then, the $\mu W$ glow discharge was stopped and the output from the bias power source 1011 was inhibited. Thus, forming of the i-type layer was completed. Then, the p-type layer was formed by heating the substrate 1004 up to 300° C. by a heater 1005 and by gradually opening the discharge valve 1043. As a result, $SiH_4$ gas, $H_2$ gas, and $B_2H_6/H_2$ gas were introduced into the decomposition chamber 1001 through the gas introduction pipe 1003. At this time, the flow of the $SiH_4$ gas was set at 10 sccm, that of the $H_2$ gas was 100 sccm, and that of the $B_2H_6/H_2$ gas was 5 sccm by adjusting the corresponding mass flow controllers 1021 to 1023. The pressure in the decomposition chamber 1001 was set at 20 mTorr by adjusting the opening of the conductance valve 1007 while observing the vacuum gage 1006. Then, the output of the $\mu W$ power source (omitted from illustration) was set at 400 mW/cm$^3$ and introduced into the decomposition chamber 1001 through the waveguide pipe (omitted from illustration), the waveguide portion 1010, and the window 1002. As a result $\mu W$ glow discharge was generated, so that forming of the p-type layer on the i-type layer was commenced until a p-type layer 5 nm in thickness was formed. Then, the $\mu W$ glow discharge was stopped and the discharge valves 1041 to 1043 and the auxiliary valve 1008 were closed, so that the gas introduction into the decomposition chamber 1001 was stopped. Thus, the process of forming the p-type layer was completed.

When the aforesaid layers are formed, the discharge valves 1041 and 1046 which are not used are, of course, completely closed. Furthermore, in order to prevent the aforesaid gases from being left in the decomposition chamber 1001 and in the piping arranged from the discharge valves 1041 to 1046 to the decomposition chamber 1001, the inside portion of the system was exhausted to a satisfactory negative pressure level in such a manner that the discharge valves 1041 to 1046 were closed, the auxiliary valve 1008 opened, and the conductance valve 1007 fully opened.

Then, ITO $(In_2O_3 + SnO_2)$ serving as a transparent electrode was evaporated on the p-type layer to a thickness of 70 nm by a vacuum evaporation method. Furthermore, Al is, as a collecting electrode, evaporated to a thickness of 2 $\mu m$ by the vacuum evaporation method. As a result, a photovoltaic device was manufactured (Cell No. Example 1).

The aforesaid conditions for manufacturing the photovoltaic device are shown in Table 1.

TABLE 1

| Substrate | SUS 430BA, 50 mm square, thickness: 1 mm |
| --- | --- |
| | Surface is mirror-finished and a thin silver film is evaporated to 0.1 $\mu m$ thickness |
| Transparent conductive layer | ZnO thin film 1 $\mu m$ in thickness |
| Conditions for forming the layers | |

| Name | Gas and flow rate (sccm) | | $\mu W$ power (mW/cm$^3$) | Internal pressure (mTorr) | Temperature of substrate (°C.) | bias | thickness (nm) |
| --- | --- | --- | --- | --- | --- | --- | --- |
| n-type layer | SiH$_4$ | 30 | 50 | 10 | 350 | omitted | 10 |
| | PH$_3$/H$_2$ (diluted to 10%) | 6 | | | | | |
| | NO/He (diluted to 0.1%) | 3 | | | | | |
| | Zn (CH$_3$)$_2$/He | $5 \times 10^{-7}$ | | | | | |

TABLE 1-continued

| | | mol/min | | | | | | |
|---|---|---|---|---|---|---|---|---|
| i-type layer | $SiH_4$ | 100 | 200 | 5 | 350 | RF 20 mW/$cm^3$ DC 50 V | 400 | |
| | $H_2$ | 200 | | | | | | |
| p-type layer | $SiH_4$ | 10 | 400 | 20 | 300 | omitted | 5 | |
| | $H_2$ | 100 | | | | | | |
| | $B_2H_6/H_2$ (diluted to 10%) | 5 | | | | | | |
| Transparent Electrode | ITO ($In_2O_3$ + $SnO_2$) 70 nm | | | | | | | |
| Collecting Electrode | Al 2 μm | | | | | | | |

COMPARATIVE EXAMPLE 1

A transparent electrode, an n-type layer, an i-type layer, a p-type layer, a transparent electrode and a collecting electrode were formed on a conductive substrate, under the same conditions as that in Example 1, except that NO/He gas and $Zn(CH_3)_2$/He gas were not introduced into the deposition chamber during formation of the n-type layer, whereby a photovoltaic device was obtained (Cell No. Comparative Example 1). Initial characteristics and degradation characteristics of the photovoltaic devices of Example 1 (Cell No. Example 1) and Comparative Example 1 (Cell No. Comparative Example 1) were evaluated.

The evaluation of initial characteristics was conducted by subjecting these photovoltaic devices to irradiation with light AM-1.5 (100 mW/$cm^2$) and then measuring photoelectric conversion efficiency. It was confirmed that the photoelectric conversion efficiency of the photovoltaic device of Example 1 (Cell No. Example 1) is 1.03 times as high as that exhibited by the photovoltaic device of Comparative Example 1 (Cell No. Comparative Example 1).

The degradation characteristic was evaluated by measuring photoelectric conversion efficiency, after 2000-hour storage of these two types of photovoltaic devices, with light of AM-1.5 (100 mW/$cm^2$). It was confirmed that the photoelectric conversion efficiency of the photovoltaic device of Example 1 (Cell No. Example 1) is 1.15 times as high as that exhibited by the photovoltaic device of Comparative Example 1 (Cell No. Comparative Example 1), thus proving the superiority of the photovoltaic device of the present invention.

EXAMPLE 2

A photovoltaic device was produced by a process in which a transparent conductive layer of $SnO_2$ was formed on the conductive substrate to a thickness of 1 μm by sputtering, in place of the ZnO used in Example 1. Then, an n-type layer was formed by using 30 SCCM of $SiH_4$ gas and 6 SCCM of $PH_3/H_2$ gas (10% diluted), while introducing, in place of the NO/He gas and $Zn(CH_3)_2$/He gas of Example 1, 1 SCCM of $SnH_4/H_2$ gas (1% diluted) and 3 SCCM of $O_2$/He gas (0.1% diluted). The formation of the n-type layer was conducted at a pressure of 10 mTorr and substrate temperature of 350° C., under the supply of electrical power from a μw power supply (50 mW/$cm^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-1). The initial characteristics and degradation characteristics of this photovoltaic device were evaluated by the same method as Example 1. It was confirmed that the initial characteristics and degradation characteristics are respectively 1.02 and 1.17 times as high as those of Comparative Example 1.

A photovoltaic device also was produced by a process in which a transparent conductive layer of $In_2O_3$ was formed to a thickness of 1 μm by sputtering, in place of the ZnO used in Example 1. Then, an n-type layer was formed by using 30 SCCM of $SiH_4$ gas and 6 SCCM of $PH_3/H_2$ gas (10% diluted), while introducing, in place of the NO/He gas and $Zn(CH_3)$/He gas of Example 1, $5 \times 10^{-7}$ mol/min of $In(CH_3)_3$/He gas and 3 SCCM of $O_2$/He (0.1% diluted). The formation of the n-type layer was conducted at a pressure of 10 mTorr and substrate temperature of 350° C., under the supply of electrical power from a μw power supply (50 mW/$cm^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-2). The initial characteristics and degradation characteristics of this photovoltaic device were evaluated by the same method as Example 1. It was confirmed that the initial characteristics and degradation characteristics are respectively 1.03 and 1.18 times as high as those of Comparative Example 1.

A photovoltaic device also was produced by a process in which a transparent conductive layer of ITO was formed to a thickness of 1 μm by sputtering, in place of the ZnO used in Example 1. Then, an n-type layer was formed by using 30 SCCM of $SiH_4$ gas and 6 SCCM of $PH_3/H_2$ gas (10% diluted), while introducing, in place of the NO/He gas and $Zn(CH_3)_2$/He gas of Example 1, 0.7 SCCM of $SnH_4$/He gas (1% diluted), $3 \times 10^{-7}$ mol/min of $In(CH_3)_3$/He gas, and 4 SCCM of $O_2$/He gas (0.1% diluted). The formation of the n-type layer was conducted at a pressure of 10 mTorr and substrate temperature of 350° C., under the supply of electrical power from a μw power supply (50 nW/$cm^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-3). The initial characteristics and degradation characteristics of this photovoltaic device were evaluated by the same method as Example 1. It was confirmed that the initial characteristics and degradation characteristics are respectively 1.04 and 1.14 times as high as those of Comparative Example 1.

A photovoltaic device also was produced by a process in which a transparent conductive layer of CdO was formed to a thickness of 1 μm by sputtering, in place of the ZnO used in Example 1. Then, an n-type layer was formed by using 30 SCCM of SiH$_4$ gas and 6 SCCM of PH$_3$/H$_2$ gas (10% diluted), while introducing, in place of the NO/He gas and Zn(CH$_3$)$_2$ gas of Example 1, 7×10$^{-7}$ mol/min of Cd(CH$_3$)$_2$/He gas and 4 SCCM of NO/He gas (0.1% diluted). The formation of the n-type layer was conducted at a pressure of 10 mTorr and substrate temperature of 350° C., under the supply of electrical power from a μw power supply (50 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-4). The initial characteristics and degradation characteristics of this photovoltaic device were evaluated by the same method as Example 1. It was confirmed that the initial characteristics and degradation characteristics are respectively 1.03 and 1.16 times as high as those of Comparative Example 1.

A photovoltaic device was produced by a process in which a transparent conductive layer Cd$_2$SnO$_4$ was formed to a thickness of 1 μm by sputtering, in place of the ZnO used in Example 1. Then, an n-type layer was formed by using 30 SCCM of SiH$_4$ gas and 6 SCCM of PH$_3$/H$_2$ gas (10% diluted), while introducing, in place of the NO/He gas and Zn(CH$_3$)$_2$/He gas of Example 1, 5×10$^{-7}$ mol/min of Cd(CH$_3$)$_2$/He gas, 0.7 SCCM of SnH$_4$/He gas (1% diluted, and 5 SCCM of O$_2$/He gas (0.1% diluted). The formation of the n-type layer was conducted at a pressure of 10 mTorr and substrate temperature of 350° C., under the supply of electrical power from a μw power supply (50 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-5). The initial characteristics and degradation characteristics of this photovoltaic device were evaluated by the same method as Example 1. It was confirmed that the initial characteristics and degradation characteristics are respectively 1.02 and 1.13 times as high as those of Comparative Example 1.

A photovoltaic device also was produced by a process in which a transparent conductive layer TiO$_2$ was formed to a thickness of 1 μm by sputtering, in place of the ZnO used in Example 1. Then, an n-type layer was formed by using 30 SCCM of SiH$_4$ gas and 6 SCCM of PH$_3$/H$_2$ gas (10% diluted), while introducing, in place of the NO/He gas and Zn(CH$_3$)$_2$/He gas of Example 1, 5×10$^{-7}$ mol/min of TiCl$_4$ gas, 2 SCCM of O$_2$/He gas (0.1% diluted). The formation of the n-type layer was conducted at a pressure of 10 mTorr and substrate temperature of 350° C., under the supply of electrical power from a μw power supply (50 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-6). The initial characteristics and degradation characteristics of this photovoltaic device were evaluated by the same method as Example 1. It was confirmed that the initial characteristics and degradation characteristics are respectively 1.03 and 1.16 times as high as those of comparative Example 1.

A photovoltaic device was produced by a process in which a transparent conductive layer of Ti$_2$N$_3$ was formed to a thickness of 1 μm by sputtering, in place of the ZnO used in Example 1. Then, an n-type layer was formed by using 30 SCCM of SiH$_4$ gas and 6 SCCM of PH$_3$/H$_2$ gas (10% diluted), while introducing, in place of the NO/He gas and Zn(CH$_3$)$_2$/He gas of Example 1, 5×10$^{-7}$ mol/min of TiCl$_4$ gas, and 3 SCCM of N$_2$/He gas (0.1% diluted). The formation of the n-type layer was conducted at a pressure of 10 mTorr and substrate temperature of 350° C., under the supply of electrical power from a μw power supply (50 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-7). The initial characteristics and degradation characteristics of this photovoltaic device were evaluated by the same method as Example 1. It was confirmed that the initial characteristics and degradation characteristics are respectively 1.02 and 1.14 times as high as those of Comparative Example 1.

The results of evaluation of performance of the photovoltaic devices are shown in Table 2. As will be seen from this Table, superior characteristics are obtained with the photovoltaic devices produced in accordance with the invention in which the layer of the first conductivity type contains an element which forms the transparent conductive layer.

TABLE 2

| Cell No. | Transparent Conductive Layer | Types and Rates of Gases | Initial Characteristics | Degradation Characteristics |
| --- | --- | --- | --- | --- |
| Ex. 2-1 | SnO$_2$ | SnH$_4$/H$_2$ (1% dilution) 1 sccm<br>O$_2$/He (0.1% dilution) 2 sccm | 1.02 | 1.17 |
| Ex. 2-2 | In$_2$O$_3$ | In(CH$_3$)$_3$/He 5 × 10$^{-7}$ mol/min<br>O$_2$/He (0.1% dilution) 3 sccm | 1.03 | 1.18 |
| Ex. 2-3 | ITO (SnO$_2$ + In$_2$O$_3$) | SnH$_4$/He (1% dilution) 0.7 sccm<br>In(CH$_3$)$_3$/He 3 × 10$^{-7}$ mol/min<br>O$_2$/He (0.1% dilution) 4 sccm | 1.04 | 1.14 |
| Ex. 2-4 | CdO | Cd(CH$_3$)$_2$/He 7 × 10$^{-7}$ mol/min<br>NO/He (0.1% dilution) 4 sccm | 1.03 | 1.16 |

TABLE 2-continued

| Cell No. | Transparent Conductive Layer | Types and Rates of Gases | Initial Characteristics | Degradation Characteristics |
|---|---|---|---|---|
| Ex. 2-5 | $Cd_2SnO_4$ | $Cd(CH_3)_2/He$ $5 \times 10^{-7}$ mol/min<br>$SnH_4/He$ (1% dilution) 0.7 sccm<br>$O_2He$ (0.1% dilution) 2 sccm | 1.02 | 1.13 |
| Ex. 2-6 | $TiO_2$ | $TiCl_4$ $5 \times 10^{-7}$ mol/min<br>$O_2He$ (0.1% dilution) 2 sccm | 1.03 | 1.16 |
| Ex. 2-7 | $Ti_2N_3$ | $TiCl_4$ $5 \times 10^{-7}$ mol/min<br>$N_2/He$ (1% dilution) 3 sccm | 1.02 | 1.14 |

Initial and degradation characteristics are normalized by values of Comparative Example 1.

EXAMPLE 3

Photovoltaic devices of the present invention were also formed by an RF glow discharge decomposition technique.

Figure 4:
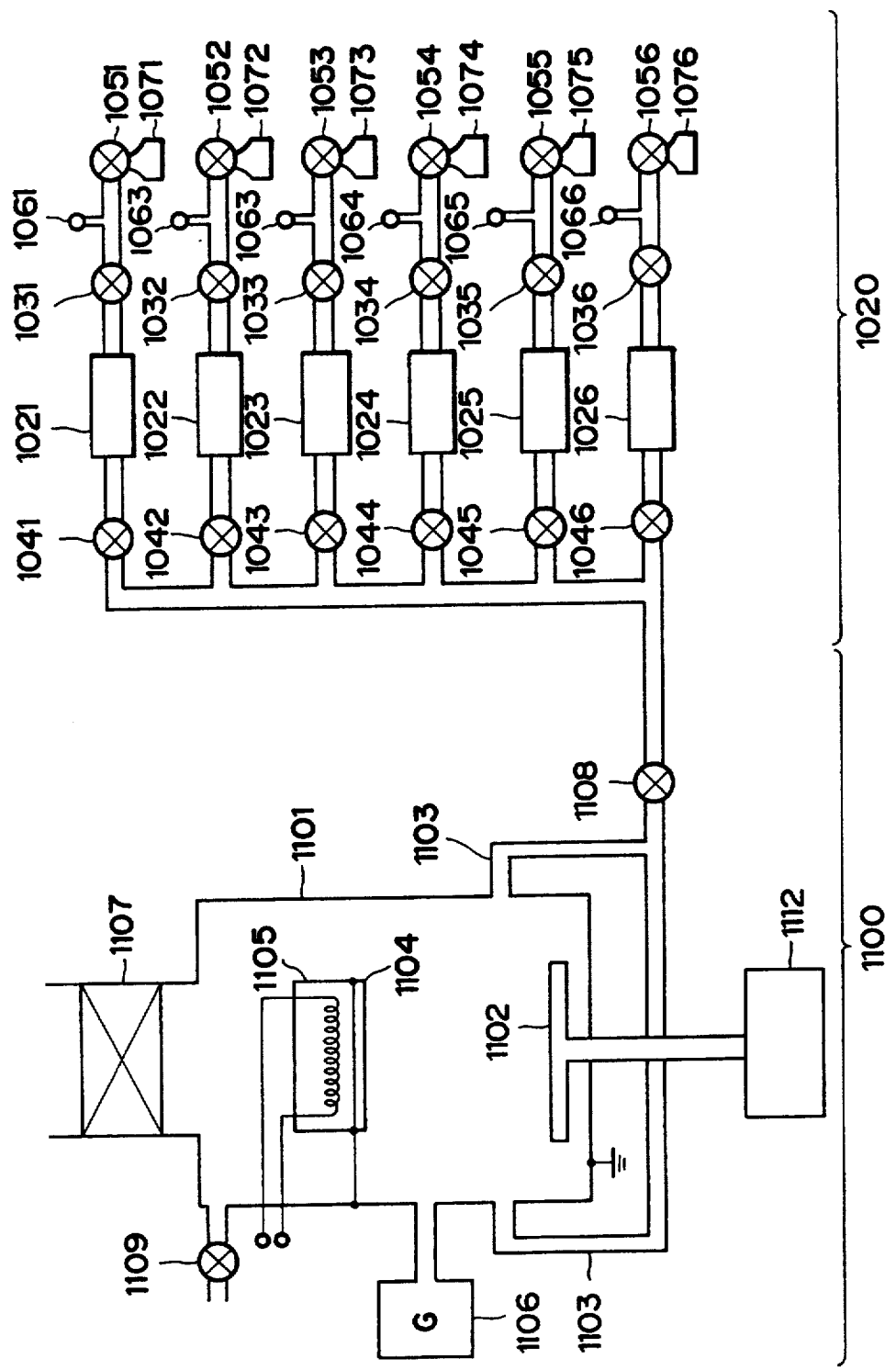
FIG. 4 is a schematic view which illustrates an apparatus for manufacturing the photovoltaic device according to the present invention by a glow discharge method in which radio frequency (RF) is used.

FIG. 4 illustrates an apparatus for producing a photovoltaic device by RF glow discharge, composed of a raw material gas supply apparatus 1020 used in Example 1 and a deposition apparatus 1100 used specifically for this Example.

Reference numeral 1104 denotes a conductive substrate similar to that used in Example 1, having thereon a transparent conductive layer of 1 μm thickness as in Example 1.

The gas cylinders 1071 to 1076 were charged with the same raw material gases as those employed in Example 1. These gases were introduced into mass flow controllers 1021 to 1026 by the same method as Example 1.

Then, an n-type layer as the layer of the first conductivity type, an i-type layer, and a p-type layer as the layer of the second conductivity type were successively formed on the substrate 1104.

The n-type layer was formed by the following process. While the substrate 1104 was heated by heater 1105 to 300° C., the discharge valves 1041, 1042 and 1044 to 1046, as well as the auxiliary valve 1108, were gradually opened to introduce $SiH_4$ gas, $H_2$ gas, $PH_3/H_2$ gas, NO/He gas, and $Zn(CH_3)_2/He$ gas into the deposition chamber 1101, through the gas introduction pipe 1103. The rates of supply of the gases were controlled by the respective mass flow controllers 1021, 1022, and 1024 to 1026, such that the $SiH_4$ gas was supplied at a rate of 2 SCCM, $H_2$ gas at 20 SCCM, $PH_3/H_2$ gas at 0.5 SCCM, NO/He gas at 0.1 SCCM, and $Zn(CH_3)_2/He$ gas at $5 \times 10^{-8}$ mol/min. The degree of opening of the conductance valve 1107 was adjusted in accordance with the reading of the vacuum gauge 1106 such that a pressure of 1 Torr was maintained in the deposition chamber 1101. Then, with the output power of the RF power supply (not shown) set to 5 $mW/cm^3$, RF power was supplied to the cathode 1102 via the RF matching box 1112 so as to trigger an RF glow discharge, thereby commencing deposition of the n-type layer on the transparent conductive layer. The RF discharge was stopped when the thickness of the n-type layer reached 10 nm. Then, the discharge valves 1041, 1042, and 1044 to 1046, as well as the auxiliary valve 1108, were closed to terminate the supply of the gas into the deposition chamber 1101, thus completing formation of the n-type layer.

Subsequently, the i-type layer was formed in accordance with the following procedure.

While the substrate 1104 was heated by the heater 1105 to 300° C., the discharge valves 1041 and 1042, as well as the auxiliary valve 1108, were gradually opened to introduce $SiH_4$ gas and $H_2$ gas into the deposition chamber 1101, through the gas introduction pipe 1103. The rates of supply of the gases were controlled by the respective mass flow controllers 1021 and 1022, such that the $SiH_4$ gas was supplied at a rate of 2 SCCM and $H_2$ gas at 20 SCCM. Then, with the power of the RF power supply (not shown) set to 5 $mW/cm^3$, RF power was supplied to the cathode 1102 via the RF matching box 1112 so as to trigger an RF glow discharge, thereby commencing deposition of the i-type layer on the n-type layer. The RF discharge was stopped when the thickness of the i-type layer reached 400 nm, thus completing formation of the i-type layer.

The formation of the p-type layer was conducted as follows. While the substrate 1104 was heated by heater 1005 to 250° C., the discharge valve 1043 was gradually opened to introduce $SiH_4$ gas, $H_2$ gas, and $B_2H_6/H_2$ gas into the deposition chamber 1101, through the gas introduction pipe 1103. The rates of supply of the gases were controlled by the respective mass flow controllers 1021, 1022, and 1023, such that the $SiH_4$ gas was supplied at a rate of 0.5 SCCM, $H_2$ gas at 50 SCCM, and $B_2H_6/H_2$ gas at 0.5 SCCM. The degree of opening of the conductance valve 1107 was adjusted in accordance with the reading of the vacuum gauge 1106 such that a pressure of 1 Torr was maintained in the deposition chamber 1101. Then, with the power of the RF power supply (not shown) set to 200 $mW/cm^3$, RF power was supplied to the cathode 1102 via the RF matching box 1112 so as to trigger an RF glow discharge, thereby commencing deposition of the p-type layer on the i-type layer. The RF discharge was stopped when the thickness of the n-type layer reached 15 nm. Then, the discharge valves 1041 to 1043, as well as the auxiliary valve 1108, were closed to terminate the supply of the gases into the deposition chamber 1101, thus completing formation of the p-type layer.

Valves 1041 to 1046 were completely closed unless supply of gases through these valves was necessary during formation of the successive layers. In order to prevent the gases from stagnating in the deposition chamber 1101, as well as in the pipeline between the discharge valve 1041 to 1046, an operation was conducted as required in which the whole system was evacuated to a high degree of vacuum, with the discharge valves 1041 to 1046 closed and the auxiliary valve 1108 opened, while the conductance valve 1107 was fully opened.

Subsequently, a transparent electrode and a collecting electrode were formed by deposition, whereby a photovoltaic device was obtained (Cell No. Example 3).

The above-described conditions of production of the photovoltaic device are shown in Table 3.

TABLE 3

| | | | | | |
|---|---|---|---|---|---|
| Substrate | SUS 430BA, 50 mm square, thickness: 1 mm | | | | |
| | Surface is mirror-finished and a thin silver film is evaporated to 0.1 μm thickness | | | | |
| Transparent conductive layer | ZnO thin film 1 μm in thickness | | | | |
| Conditions for forming the layers | | | | | |

| Name | Gas and flow rate (sccm) | | RF power (mW/cm$^3$) | Internal pressure (Torr) | Temperature of substrate (°C.) | Thickness (nm) |
|---|---|---|---|---|---|---|
| n-type layer | SiH$_4$ | 2 | 5 | 1 | 300 | 10 |
| | H$_2$ | 20 | | | | |
| | PH$_3$/H$_2$ (diluted to 10%) | | | | | |
| | NO/He (diluted to 10%) | 0.1 | | | | |
| | Zn (CH$_3$)$_2$/He $5 \times 10^{-7}$ mol/min | | | | | |
| i-type layer | SiH$_4$ | 2 | 5 | 1 | 300 | 400 |
| | H$_2$ | 20 | | | | |
| p-type layer | SiH$_4$ | 0.5 | 200 | 1 | 250 | 5 |
| | H$_2$ | 50 | | | | |
| | B$_2$H$_6$/H$_2$ (diluted to 10%) | 0.5 | | | | |
| Transparent Electrode | ITO (In$_2$O$_3$ + SnO$_2$) 70 nm | | | | | |
| Collecting Electrode | Al 2 μm | | | | | |

COMPARATIVE EXAMPLE 2

A transparent electrode, an n-type layer, an i-type layer, a p-type layer, a transparent electrode, and a collecting electrode were formed on a conductive substrate, under the same conditions as those in Example 3 except that NO/He gas and Zn(CH$_3$)$_2$/He gas were not introduced into the deposition chamber during formation of the n-type layer, whereby a photovoltaic device was obtained (Cell No. Comparative Example 2). Initial characteristics and degradation characteristics were evaluated on the photovoltaic devices of Example 1 (Cell No. Example 2) and Comparative Example 2 (Cell No. Comparative Example 2).

The evaluation was carried out by the same method as Example 1. It was confirmed that the photoelectric conversion efficiency of the photovoltaic device of Example 1 (Cell No. Example 1) is 1.02 times as high as that exhibited by the photovoltaic device of Comparative Example 2 (Cell No. Comparative Example 2), thus proving superiority of the photovoltaic device of the present invention.

EXAMPLE 4

A photovoltaic device was produced by a process in which a transparent conductive layer of SnO$_2$ was formed to a thickness of 1 μm by sputtering, in place of the ZnO used in Example 3. Then, an n-type layer was formed by using 2 SCCM of SiH$_4$ gas and 0.5 SCCM of PH$_3$/H$_2$ gas (10% diluted), while introducing, in place of the NO/He gas and Zn (CH$_3$)$_2$/He gas of Example 3, 0.1 SCCM of SnH$_4$/H$_2$ gas (1% diluted) and 0.3 SCCM of O$_2$/He gas (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 3, whereby a photovoltaic device was obtained (Example 4-1). The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.03 and 1.16 times as high as those of Comparative Example 2.

A photovoltaic device also was produced by a process in which a transparent conductive layer of In$_2$O$_3$ was formed to a thickness of 1 μm by sputtering, in place of the ZnO used in Example 3. Then, an n-type layer was formed by using 2 SCCM of SiH$_4$ gas, 20 SCCM of H$_2$ gas, and 0.5 SCCM of PH$_3$/H$_2$ gas (10% diluted), while introducing, in place of the NO/He gas and Zn(CH$_3$)$_2$/He gas of Example 3, $4 \times 10^{-8}$ mol/min of In(CH$_3$)$_3$/He gas and 0.3 SCCM of NO/He (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 4-2).

The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.04 and 1.17 times as high as those of Comparative Example 2.

A photovoltaic device also was produced by a process in which a transparent conductive layer of ITO(-SnO)$_2$+In$_2$O$_3$) was formed to a thickness of 1 μm by sputtering, in place of the ZnO used in Example 3. Then, an n-type layer was formed by using 2 SCCM of SiH$_4$ gas, 20 sccm of H$_2$ gas, and 0.5 SCCM of PH$_3$/H$_2$ gas (10% diluted), while introducing, in place of the NO/He gas and Zn(CH$_3$)$_2$/He gas of Example 3, 0.1 SCCM of SnH$_4$/He gas (1% diluted), $4 \times 10^{-8}$ mol/min of In(CH$_3$)$_3$/He gas, and 0.4 SCCM of O$_2$/He gas (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 3, whereby a photovoltaic device was obtained (Example 4-3). The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.02 and 1.15 times as high as those of Comparative Example 2.

A photovoltaic device also was produced by a process in which a transparent conductive layer of CdO was formed to a thickness of 1 μm by sputtering, in place of the ZnO used in Example 3. Then, an n-type layer was formed by using 2 SCCM of SiH$_4$ gas, 20 SCCM of H$_2$ gas, and 0.5 SCCM of PH$_3$/H$_2$ gas (10% diluted), while introducing, in place of the NO/He gas and Zn(CH$_3$)$_2$/He gas of Example 3, 6×10$^{-8}$ mol/min of Cd(CH$_3$)$_2$/He gas and 3 SCCM of NO/He gas (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 3, whereby a photovoltaic device was obtained (Example 4-4). The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.03 and 1.15 times as high as those of Comparative Example 2.

A photovoltaic device also was produced by a process in which a transparent conductive layer of Cd$_2$SnO$_4$ was formed to a thickness of 1 μm by sputtering, in place of the ZnO used in Example 3. Then, an n-type layer was formed by using 2 SCCM of SiH$_4$ gas, 20 SCCM of H$_2$ gas, and 0.5 SCCM of PH$_3$/H$_2$ gas (10% diluted), while introducing, in place of the NO/He gas and Zn(CH$_3$)$_2$/He gas, of Example 3, 6×10$^{-8}$ tool/rain of Cd(CH$_3$)$_2$/He gas, 0.5 SCCM of SnH$_4$/He gas (1% diluted), and 0.5 SCCM of NO/He gas (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 4-5). The initial characteristics and degradation characteristics of this photovoltaic device were evaluated by the same method as Example 1, Example 3, Comparative Example 1 and Comparative Example 2. It was confirmed that the initial characteristics and degradation characteristics are respectively 1.04 and 1.16 times as high as those of Comparative Example 2.

A photovoltaic device also was produced by a process in which a transparent conductive layer of TiO$_2$ was formed to a thickness of 1 μm by sputtering, in place of the ZnO used in Example 3. Then, an n-type layer was formed by using 2 SCCM of SiH$_4$ gas, 20 SCCM of H$_2$ gas, and 0.5 SCCM of PH$_3$/H$_2$ gas (10% diluted), while introducing, in place of the NO/He gas and Zn(CH$_3$)$_2$/He gas of Example 3, 4×10$^{-8}$ mol/min of TiCl$_4$ gas and 0.1 SCCM of O$_2$/He gas (0.1% diluted). The formation of the n-type layer was conducted at a pressure of 1 Torr and substrate temperature of 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode, and a collecting electrode, under the same conditions as Example 1, whereby a photovoltaic device was obtained (Example 2-6). The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.02 and 1.14 times as high as those of Comparative Example 2.

A photovoltaic device also was produced by a process in which a transparent conductive layer of Ti$_2$N$_3$ was formed to a thickness of 1 μm by sputtering, in place of the ZnO used in Example 3. Then, an n-type layer was formed by using 2 SCCM of SiH$_4$ gas, 20 SCCM of H$_2$ gas, and 0.5 SCCM of PH$_3$/H$_2$ gas (10% diluted), while introducing, in place of the NO/He gas and Zn(CH$_3$)$_2$/He gas of Example 3, 3×10$^{-8}$ mol/min of TiCl$_4$ gas and 0.2 SCCM of N$_2$/He gas (0.1% diluted). The formation of the n-type layer was conducted at a pressure of 1 Torr and substrate temperature 300° C., under the supply of electrical power from an RF power supply (5 mW/cm$^3$). The thickness of the n-type layer thus formed was 10 nm. On the thus-formed n-type layer, there were successively formed an i-type layer, p-type layer, a transparent electrode and a collecting electrode, under the same conditions as Example 3, whereby a photovoltaic device was obtained (Example 4-7). The initial characteristics and degradation characteristics of this photovoltaic device were evaluated by the same method as Example 1, Example 3, Comparative Example 1, and Comparative Example 2. It was confirmed that the initial characteristics and degradation characteristics are respectively 1.03 and 1.15 times as high as those of Comparative Example 2.

The results of evaluation of the performance of the photovoltaic devices are shown in Table 4. As will be seen from this Table, superior characteristics are obtained with the photovoltaic devices produced in accordance with the invention in which the layer of the first conductivity type contains an element which forms the transparent conductive layer.

TABLE 4

| Cell No. | Transparent Conductive Layer | Types and Rates of Gases | Initial Characteristics | Degradation Characteristics |
|---|---|---|---|---|
| Ex. 4-1 | SnO$_2$ | SnH$_4$/H$_2$ (1% dilution) 0.1 sccm | 1.03 | 1.16 |

TABLE 4-continued

| Cell No. | Transparent Conductive Layer | Types and Rates of Gases | Initial Characteristics | Degradation Characteristics |
|---|---|---|---|---|
| Ex. 4-2 | $In_2O_3$ | $O_2$/He (1% dilution) 0.3 sccm<br>$In(CH_3)_3$/He $4 \times 10^{-8}$ mol/min | 1.04 | 1.17 |
| Ex. 4-3 | ITO ($SnO_2$ + $In_2O_3$) | $SnH_4$/He (1% dilution) 0.1 sccm<br>$In(CH_3)_3$/He $4 \times 10^{-8}$ mol/min<br>NO/He (0.1% dilution) 0.3 sccm | 1.02 | 1.15 |
| Ex. 4-4 | CdO | $O_2$/He (0.1% dilution) 0.4 sccm<br>$Cd(CH_3)_2$/He $6 \times 10^{-8}$ mol/min<br>NO/He (0.1% dilution) 4 sccm | 1.03 | 1.14 |
| Ex. 4-5 | $Cd_2SnO_4$ | $Cd(CH_3)_2$/He $3 \times 10^{-8}$ mol/min<br>$SnH_4$/He (1% dilution) 0.5 sccm<br>NO/He (0.1% dilution) 0.5 sccm | 1.04 | 1.16 |
| Ex. 4-6 | $TiO_2$ | $TiCl_4$ $4 \times 10^{-8}$ mol/min<br>$O_2$/He (0.1% dilution) 0.1 sccm | 1.02 | 1.14 |
| Ex. 4-7 | $Ti_2N_3$ | $TiCl_4$ $3 \times 10^{-8}$ mol/min<br>$N_2$/He (1% dilution) 0.2 sccm | 1.03 | 1.15 |

EXAMPLE 5

A photovoltaic device (Cell No. Example 5) was produced by forming, on a conductive substrate, a transparent conductive layer, an n-type layer, an i-type layer, a p-type layer, a transparent electrode, and a collecting electrode, under the same conditions as Example 1, except that the n-type layer was prepared under varying conditions as shown in Table 5 while varying the flow rates of NO/He gas and $Zn(CH_3)_2$/He gas, so as to realize thicknesswise distributions of oxygen atoms and zinc atoms in the n-type layer.

The initial characteristics and degradation characteristics of the thus-obtained photovoltaic device were evaluated by the same method as Example 1. Superior initial and degradation characteristics, substantially equivalent to those of Example 1, were confirmed, thus proving superiority of the present invention.

EXAMPLE 6

A photovoltaic device (Cell No. Example 6) was produced by forming, on a conductive substrate, a transparent conductive layer, an n-type layer, an i-type layer, a p-type layer, a transparent electrode, and a collecting electrode, under the same conditions as Example 1, except that the n-type layer was prepared under varying conditions as shown in Table 5 while supplying NO/He gas and $Zn(CH_3)_2$/He gas only during deposition of the initial 10 nm thickness on the substrate.

The initial characteristics and degradation characteristics of the thus-obtained photovoltaic device were evaluated by the same method as Example 1. Superior initial and degradation characteristics, substantially equivalent to those of Example 1, were confirmed, thus proving superiority of the present invention.

TABLE 5

| Layer name | Types and Rates of Gases (sccm) | μW power (mW/cm³) | Internal press. (mTorr) | Substrate Temp. (°C.) | Bias | Layer thickness (nm) |
|---|---|---|---|---|---|---|
| n-type layer | $SiH_4$<br>$PH_3/H_2$ (10% dilution)<br>NO/He (0.1% dilution) decreased from 4 to 0 at constant rate<br>$Zn(CH_3)_2$/He decreased at constant rate from $5 \times 10^{-7}$ mol/min to 0 | 30<br>6 | 50 | 10 | 350 | None | 15 |

TABLE 6

| Layer name | Types and Rates of Gases (sccm) | μW power (mW/cm³) | Internal press. (mTorr) | Substrate Temp. (°C.) | Bias | Layer thickness (nm) |
|---|---|---|---|---|---|---|
| n-type layer | $SiH_4$<br>$PH_3/H_2$ (10% dilution)<br>NO/He (0.1% dilution) applied only to 10 nm on a substrate<br>$Zn(CH_3)_2$/He applied only to 10 nm on substrate $5 \times 10^{-7}$ mol/min | 30<br>6<br><br>3 | 50 | 10 | 350 | None | 15 |

EXAMPLE 7

A photovoltaic device (Cell No. Example 7) was produced by forming, on a conductive substrate, a transparent conductive layer, an n-type layer, an i-type layer, a p-type layer, a transparent electrode, and a collecting electrode, under the same conditions as Example 1 except that $CH_4$ gas was used in the formation of the i-type layer and p-type layer and varying conditions as shown in Table 8 were employed in the formation of the i-type layer and the p-type layer.

TABLE 8

| Layer name | Types and Rates of Gases (sccm) | | $\mu$W power (mW/cm$^3$) | Internal press. (mTorr) | Substrate Temp. (°C.) | Bias | Layer thickness s (nm) |
|---|---|---|---|---|---|---|---|
| i-type layer | SiH$_4$ | 100 | 300 | 18 | 350 | RF 35 mW/cm$^3$ | 400 |
| | CH$_4$ | 10 | | | | DC 90V | |
| | H$_2$ | 300 | | | | | |
| p-type layer | SiH$_4$ | 40 | 500 | 20 | 350 | RF 60 mW/cm$^3$ | 5 |
| | CH$_4$ | 2 | | | | DC | |
| | H$_2$ | 400 | | | | 90V | |
| | B$_2$H$_6$/H$_2$ (10% dilution) | 10 | | | | | | collecting electrode, under the same conditions as Example 1 except that GeH$_4$ gas was used in the formation of the i-type layer and varying conditions as shown in Table 7 were employed in the formation of the i-type layer and the p-type layer.

TABLE 7

| Layer name | Types and Rates of Gases (sccm) | | $\mu$W power (mW/cm$^3$) | Internal press. (mTorr) | Substrate Temp. (°C.) | Bias | Layer thickness s (nm) |
|---|---|---|---|---|---|---|---|
| i-type layer | SiH$_4$ | 70 | 150 | 5 | 350 | RF 25 mW/cm$^3$ | 300 |
| | GeH$_4$ (10% dilution) | 30 | | | | DC 80V | |
| | H$_2$ | 50 | | | | | |
| p-type layer | SiH$_4$ | 40 | 50 | 50 | 300 | None | 5 |
| | B$_2$H$_6$/H$_2$ (10% dilution) | 15 | | | | | |

COMPARATIVE EXAMPLE 3

A transparent electrode, an n-type layer, an i-type layer, a p-type, a transparent electrode, and a collecting electrode were formed on a conductive substrate, under the same conditions as that in Example 7 except that NO/He gas and Zn (CH$_3$)$_2$/He gas were not introduced into the deposition chamber during formation of the n-type layer, whereby a photovoltaic device was obtained (Cell No. Comparative Example 3). Initial characteristics and degradation characteristics of the photovoltaic devices of Example 7 (Cell No. Example 7) and Comparative Example 3 (Cell No. Comparative Example 3) were evaluated.

The evaluation was carried out by the same method as Example 1. It was confirmed that the photoelectric initial characteristics and degradation characteristics of Example 7 (Cell No. Example 7) are 1.04 times and 1.19 times as high as that exhibited by the photovoltaic device of Comparative Example 3 (Cell No. Comparative Example 3), thus proving superiority of the photovoltaic device of the present invention.

EXAMPLE 8

A photovoltaic device (Cell No. Example 8) was produced by forming, on a conductive substrate, a transparent conductive layer, an n-type layer, an i-type layer, a p-type layer, a transparent electrode, and a collecting electrode, under the same conditions as Example 1 except that $CH_4$ gas was used in the formation of the i-type layer and p-type layer and varying conditions as shown in Table 8 were employed in the formation of the i-type layer and the p-type layer.

Comparative Example 4

A transparent electrode, an n-type layer, an i-type layer, a p-type layer, a transparent electrode, and a collecting electrode were formed on a conductive substrate, under the same conditions as that in Example 8 except that NO/He gas and Zn(CH$_3$)$_2$/He gas were net introduced into the deposition chamber during formation of the n-type layer, whereby a photovoltaic device was obtained (Cell No. Comparative Example 4). Initial characteristics and degradation characteristics of the photovoltaic devices of Example 8 (Cell No. Example 8) and Comparative Example 4 (Cell No. Comparative Example 4) were evaluated.

The evaluation was carried out by the same method as Example 1. It was confirmed that the photoelectric initial characteristics and degradation characteristics of Example 8 (Cell No. Example 8) are 1.02 times and 1.17 times as high as that exhibited by the photovoltaic device of Comparative Example 4 (Cell No. Comparative Example 4), thus proving superiority of the photovoltaic device of the present invention.

EXAMPLE 9

A photovoltaic device (Cell No. Example 9) was produced by forming, on a conductive substrate, a transparent conductive layer, a p-type layer, an i-type layer, an n-type layer, a transparent electrode, and a collecting electrode, under the same conditions as Example 1 except that the p-type layer, i-type layer, and n-type layer were formed under conditions as shown in Table 9.

TABLE 9

| Layer name | Types and Rates of Gases (sccm) | $\mu$W power (mW/cm$^3$) | Internal press. (mTorr) | Substrate Temp. (°C.) | Bias | Layer thickness (nm) |
|---|---|---|---|---|---|---|
| p-type layer | SiH$_4$ | 30 | 50 | 10 | 350 | None | 10 |

TABLE 9-continued

| Layer name | Types and Rates of Gases (sccm) | μW power (mW/cm³) | Internal press. (mTorr) | Substrate Temp. (°C.) | Bias | Layer thickness (nm) |
|---|---|---|---|---|---|---|
| | $B_2H_6/H_2$ (10% dilution) | 30 | | | | |
| | NO/He (0.1% dilution) | 3 | | | | |
| | $Zn(CH_3)_2$/He $5 \times 10^{-7}$ mol/min | | | | | |
| i-type layer | $SiH_4$ | 10 | 200 | 5 | 350 | RF 20 mW/cm³ DC 90V | 400 |
| | $H_2$ | 200 | | | | | |
| n-type layer | $SiH_4$ | 10 | 300 | 15 | 300 | None | 5 |
| | $H_2$ | 200 | | | | | |
| | $PH_3/H_2$ (10% dilution) | 3 | | | | | |

COMPARATIVE EXAMPLE 5

A transparent electrode, a p-type layer, an i-type layer, an n-type layer, a transparent electrode, and a collecting electrode were formed on a conductive substrate, under the same conditions as that in Example 8 except that NO/He gas and $Zn(CH_3)_2$/He gas were not introduced into the deposition chamber during formation of the p-type layer, whereby a photovoltaic device was obtained (Cell No. Comparative Example 5). Initial characteristics and degradation characteristics of the photovoltaic devices of Example 9 (Cell No. Example 9) and Comparative Example 5 (Cell No. Comparative Example 5) were evaluated.

The evaluation was carried out by the same method as Example 1. It was confirmed that the photoelectric initial characteristics and degradation characteristics of Example 9 (Cell No. Example 9) are 1.02 times and 1.17 times as high as that exhibited by the photovoltaic device of Comparative Example 5 (Cell No. Comparative Example 5), thus proving superiority of the photovoltaic device of the photovoltaic device of the invention (Cell No. Example 9) over that of Comparative Example (Cell No. Comparative Example 5).

As will be understood from the foregoing description, the photovoltaic device of the present invention exhibits superior resistance against degradation of characteristics.

What is claimed is:

1. A photovoltaic device produced by the process which comprises forming, in sequence, on a transparent conductive layer of at least one of $In_2O_3$, ITO, ZnO, CdO, $CdSnO_4$, $TiO_2$, and $Ti_2N_3$;

(a) a non-monocrystalline layer of a first conductivity type containing Si atoms and at least one metallic element constituting said transparent conductive layer to enhance and maintain photoelectric conversion efficiency;

(b) a non-monocrystalline layer of an i-type and containing Si atoms; and (c) a non-monocrystalline layer of a second conductivity type different from the first conductivity type and containing Si atoms.

2. A photovoltaic device comprising:
a conductive substrate;
a transparent conductive layer on said conductive substrate;
a non-monocrystalline layer of a first conductivity type and containing Si atoms on said transparent conductive layer;
a non-monocrystalline layer of an i-type and containing Si atoms on said non-monocrystalline layer of the first conductivity type;
a non-monocrystalline layer of a second conductivity type different from the first conductivity type and containing Si atoms on said i-type non-monocrystalline layer; and
an electrode on said non-monocrystalline layer of the second conductivity type; wherein said transparent conductive layer is at least one of Au, Al, and Cu and said non-monocrystalline layer of the first conductivity type contains at least one metallic element constituting said transparent conductive layer.

3. A photovoltaic device according to claims 1 or 2, wherein the metallic element contained in said non-monocrystalline layer of the first conductivity type has a concentration of 0.1 atom ppm-1 atom ppm.

4. A photovoltaic device according to claims 1 or 2, wherein the metallic element contained in said non-monocrystalline layer of the first conductivity type has a concentration of 1 atom ppm-1000 atom ppm.

5. A photovoltaic device according to claims 1 or 2, wherein the metallic element contained in said non-monocrystalline layer of the first conductivity type has a concentration of 10 atom ppm-100 atom ppm.

6. A photovoltaic device according to claims 1 or 2, wherein said non-monocrystalline layer of the first conductivity type further contains carbon in a concentration of 5-50 atomic %.

7. A photovoltaic device according to claims 1 or 2, wherein said non-monocrystalline layer of the i-type further contains Ge.

8. A photovoltaic device according to claims 1 or 2, wherein said non-monocrystalline layer of the i-type further contains C.

9. A photovoltaic device according to claims 1 or 2, wherein said non-monocrystalline layer of the first conductivity type has a thickness of 1 nm-50 nm.

10. A photovoltaic device according to claim 1, wherein said transparent conductive layer is a metal oxide selected from the group consisting of $In_2O_3$, ITO, ZnO, CdO, $CdSnO_4$, and $TiO_2$ and said non-monocrystalline layer of the first conductivity type further includes oxygen.

11. A photovoltaic device according to claim 1, wherein said transparent conductive layer is $Ti_2N_3$ and said non-monocrystalline layer of the first conductivity type further contains nitrogen.

12. A photovoltaic device according to claims 1 or 2, wherein said non-monocrystalline layer of an i-type has a thickness of 100 nm-1000 nm.

* * * * *

UNITED STATES PATENT AND TRADEMARK OFFICE
CERTIFICATE OF CORRECTION

PATENT NO. : 5,338,370
DATED : August 16, 1994
INVENTOR(S) : TATSUYUKI AOIKE

It is certified that error appears in the above-indentified patent and that said Letters Patent is hereby corrected as shown below:

COLUMN 5

Line 14, "phosphorous (p)" should read --phosphorous (P)--.

COLUMN 12

Line 4, "generated" should read --was generated--.
Line 13, "$B_2H_{6/H2}$" should read --$B_2H_6/H_2$--.

COLUMN 14

Line 58, "(50nW/cm$^3$)." should read --(50mW/cm$^3$).--.

COLUMN 15

Line 9, "$Zn(CH_3)_2$" should read --$Zn(CH_3)_2$/He--.

COLUMN 16

TABLE 2, "$O_2$/He (0.1% dilution) 2" should read --$O_2$/He (0.1% dilution) 3-- and "SnH$_4$/He" should read --$S_nH_4$--.

UNITED STATES PATENT AND TRADEMARK OFFICE
CERTIFICATE OF CORRECTION

PATENT NO. : 5,338,370
DATED : August 16, 1994
INVENTOR(S) : TATSUYUKI AOIKE

It is certified that error appears in the above-indentified patent and that said Letters Patent is hereby corrected as shown below:

COLUMN 18

Line 31, "1005" should read --1105--.

COLUMN 19

TABLE 3, "$PH_3/H_2$" should read --$PH_3/H_2$    0.5--.

COLUMN 20

Line 60, "$SnO)_2$" should read --$SnO_2$--.

COLUMN 21

Line 49, "$6 \times 10^{-8}$ tool/rain" should read --$3 \times 10^{-8}$ mol/min--.

COLUMN 22

TABLE 4, "$SnH_4/H_2$" should read --$SiH_4/H_2$--.

COLUMN 23

TABLE 4-continued, "$SnH_4/He$" should read --$SnH_4$-- and after Table 4-continued, insert: --Initial and degradation characteristics are normalized by values of Comparative Example 2.--.

COLUMN 24

TABLE 6, "$5 \times 10^{-7} mol/min$" should read --$5 \times 10^{-7} mol/min$--.

UNITED STATES PATENT AND TRADEMARK OFFICE
CERTIFICATE OF CORRECTION

PATENT NO. : 5,338,370
DATED : August 16, 1994
INVENTOR(S) : TATSUYUKI AOIKE

It is certified that error appears in the above-indentified patent and that said Letters Patent is hereby corrected as shown below:

COLUMN 25

TABLE 7, "(10% dilution)" should be deleted.
Line 41, "that" should read --those--.

COLUMN 26

Line 37, "net" should read --not--.

COLUMN 27

TABLE 9-continued, " DC        should read     -- DC
                     90V "                        50V --.
Line 52, "$Ti_2N_3$;" should read --$Ti_2N_3$:--.

Signed and Sealed this

Sixteenth Day of May, 1995

BRUCE LEHMAN

Attest:

*Attesting Officer*                    *Commissioner of Patents and Trademarks*

UNITED STATES PATENT AND TRADEMARK OFFICE
CERTIFICATE OF CORRECTION

PATENT NO. : 5,338,370
DATED : August 16, 1994
INVENTOR(S) : TATSUYUKI AOIKE

It is certified that error appears in the above-indentified patent and that said Letters Patent is hereby corrected as shown below:

COLUMN 28

Line 34, "-1 atom ppm." should read -- -1 atomic percent.--

Signed and Sealed this

Fourth Day of July, 1995

Attest:

BRUCE LEHMAN

Attesting Officer    Commissioner of Patents and Trademarks